(12) United States Patent
Ikeya et al.

(10) Patent No.: US 6,423,559 B2
(45) Date of Patent: Jul. 23, 2002

(54) INTEGRATED CIRCUIT AND FABRICATING METHOD AND EVALUATING METHOD OF INTEGRATED CIRCUIT

(75) Inventors: Masahisa Ikeya; Kazuyuki Inokuchi, both of Tokyo (JP)

(73) Assignee: Oki Electric Industry Co., Tokyo (JP)

( * ) Notice: Subject to any disclaimer, the term of this patent is extended or adjusted under 35 U.S.C. 154(b) by 0 days.

(21) Appl. No.: 09/734,742

(22) Filed: Dec. 13, 2000

Related U.S. Application Data (62) Division of application No. 09/426,184, filed on Oct. 25, 1999, now Pat. No. 6,251,696, which is a division of application No. 08/864,860, filed on May 29, 1997, now Pat. No. 5,994,716.

(30) Foreign Application Priority Data

Oct. 16, 1996 (JP) ............................................. 8-273512

(51) Int. Cl.[7] .......................... G01R 31/26; H01L 21/00
(52) U.S. Cl. ............................. 438/17; 438/10; 438/15; 438/18
(58) Field of Search ............................. 438/10, 14, 15, 438/17, 18, 614; 29/822, 840, 843, 855; 257/770, 123.1, 668; 361/234

(56) References Cited

U.S. PATENT DOCUMENTS 4,894,605 A * 1/1990 Ringleb et al. ............. 324/537
5,158,911 A * 10/1992 Quentin ....................... 438/125
5,512,710 A   4/1996 Schroeder .................. 174/52.4
6,002,177 A * 12/1999 Gaynes et al. .............. 257/774

FOREIGN PATENT DOCUMENTS

DE    3 123 023    12/1982
GB    2 094 552    9/1982

OTHER PUBLICATIONS

Sergio Franco, Electric Circuits Fundamentals Saunders College Publishing, 1995, p. 74.*

* cited by examiner

Primary Examiner—Trung Dang
Assistant Examiner—William M. Brewster
(74) Attorney, Agent, or Firm—Venable; Norman N. Kunitz (57) ABSTRACT

A method of fabricating an integrated circuit of which a bonding condition can be evaluated simply is provided. Two external connecting electrodes are provided on the surface, via holes are formed below them, and conductive portions are formed in the via holes. Then, a first metal film is formed on a rear face of a chip and a second metal film is formed on a surface of a ceramic substrate, and then both of them are made contact and heated so as to bond the chip and the ceramic substrate. Further, when the first metal film is formed, a slit portion which no first metal film exists is provided. When the bonding condition is evaluated, a resistance between two external connecting electrodes is measured.

20 Claims, 8 Drawing Sheets

↓ HEATING (B)

FIG. 10
PRIOR ART

INTEGRATED CIRCUIT AND FABRICATING METHOD AND EVALUATING METHOD OF INTEGRATED CIRCUIT

This application is a division of U.S. application Ser. No. 09/426,184 filed Oct. 25, 1999, now U.S. Pat. No. 6,251,696 which is a division of U.S application Ser. No. 08/864,860 filed May 29, 1997, now U.S. Pat. No. 5,994,716 issued Nov. 30, 1999.

BACKGROUND OF THE INVENTION

1. Field of the Invention

The present invention relates to an integrated circuit, a fabricating method of the integrated circuit and an evaluating method of the integrate circuit, more particularly, to an integrated circuit including an IC (integrated circuit) chip using a semi-insulating substrate and a ceramic substrate on which the IC chip is put and the integrated circuit which can be evaluated as to a bonding condition between the IC chip and the substrate, and to a fabricating method and an evaluating method thereof.

2. Description of the Related Art

As known, when an integrated circuit is fabricated, a processing step called a die bonding is performed. The die bonding is a step that a chip (also called a die) divided in a dicing step is fixed to a substrate. It is known that there are three bonding methods such as a paste bonding, a solder bonding and an eutectic bonding.

In an integrated circuit fabricated by mounting an IC chip using semi-insulator such as GaAs or InP on a ceramic substrate, there are many cases that the solder bonding and the eutectic bonding are used for bonding the IC chip and the ceramic substrate. In the solder bonding, a foil of low melting point alloy (namely, solder) is put between the chip and the substrate. Then, the foil is reflowed by heating, whereby the chip and the ceramic substrate are bonded. Additionally, in the solder bonding, for example, when the wettability of the solder is not good for chip materials or a ceramic substrate, films including materials of which the wettabilities are good are previously formed on one or both of bonding surfaces of the chip and the ceramic substrate by a vacuum evaporation method or the like.

Figure 9:
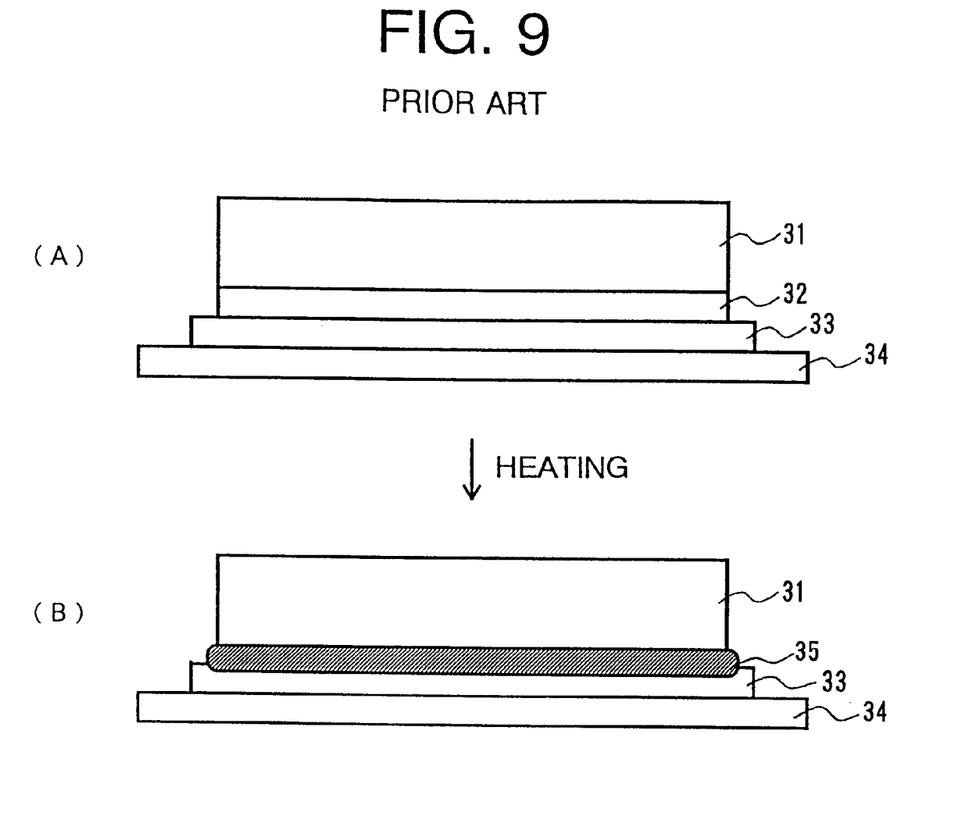
FIGS. 9(A) and 9(B) are explanatory views illustrating a conventional die bonding (eutectic bonding)

In the eutectic bonding, the chip and the ceramic substrate are bonded by using a diffuse reaction between two elements which form an eutectic alloy. That is, in the eutectic bonding, as shown in FIGS. 9(A) and 9(B), a chip 31 of which a bonding surface is provided with a film 32 including one of the two elements to be an eutectic alloy and a ceramic substrate 34 of which a bonding surface is provided with a film 33 including another element are made contact (see FIG. 9(A)) and heated temporarily, so that the chip 31 and the ceramic substrate 34 are bonded by an eutectic alloy 35 (and the film 33) (see FIG. 9(B)). In FIGS. 9(A) and 9(B), all the film 32 is changed into an eutectic alloy, however, there is a case that the film 32 remains.

Figure 10:
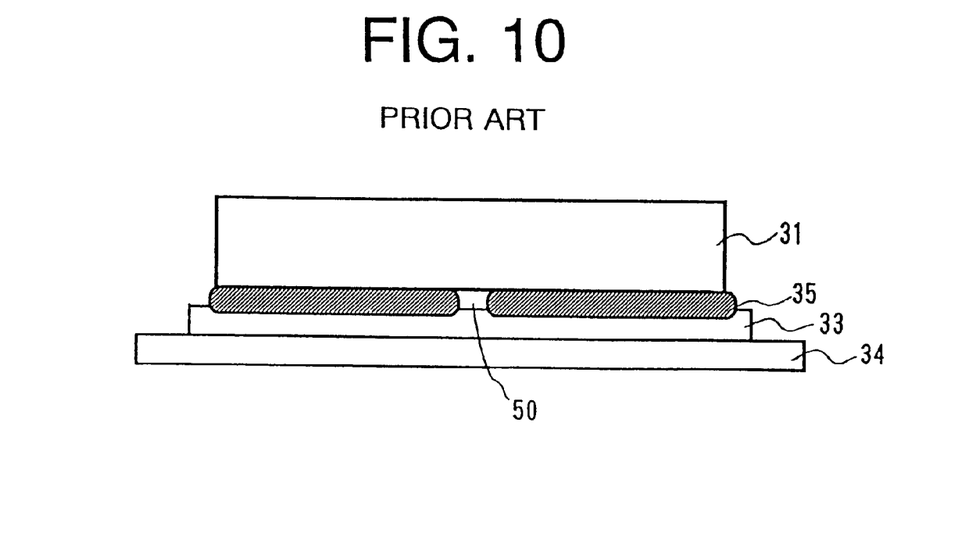
FIG. 10 is a section view for explaining problems in the conventional die bonding.

In the solder bonding or the eutectic bonding, a bonding portion with very small thermal resistance can be formed. In the eutectic bonding, however, as shown in FIG. 10, there is a case in that the eutectic alloy layer 35 is not evenly formed, so that a defect such as a cavity 50 is formed between the chip 31 and the ceramic substrate 34. In the solder bonding, there is also a case in that a cavity 50 is formed in a bonding portion.

In an integrated circuit like shown in FIG. 10, a thermal resistance between the chip 31 and the ceramic substrate 34 (particularly, around the cavity 50) is high therefore, when this integrated circuit operates, the temperature of the chip 31 raises compared with an integrated circuit of which a bonding portion in normally formed, shown in FIG. 9(B).

Particularly, in an IC chip using a semi-insulating or insulating substrate such as GaAs (gallium arsenide), InP (indium phosphorus) and sapphire, the thermal conductivity of the substrate is low, therefore, when the chip is not normally bonded to the ceramic substrate, the circuit fabricated on the chip becomes not to operate normally because of the increased temperature.

Thus, it is desirable to select integrated circuits which are not normally bonded. In conventional integrated circuits, a bonding condition is evaluated only by measuring the force required to peel the chip from the ceramic substrate or measuring the thermal resistance actually. The former is a destructive inspection, therefore, bonding conditions of the integrated circuits can not be evaluated individually by the former method. The latter is a non-destructive inspection, and can be used for integrated circuits individually, however, it takes a long time to measure the thermal resistance. Thus, in the latter method, there is no choice except for that some of plural integrated circuits are evaluated as samples.

SUMMARY OF THE INVENTION

Accordingly, it is an object of the present invention to provide an integrated circuit of which a boding state can be simply evaluated. It is another object of the present invention to provide a fabricating method of an integrated circuit of which a boding state can be simply evaluated.

To solve the above described problems, in the present invention, an integrated circuit, which comprises a semiconductor chip having active elements on a main face and a substrate having an electrode on a main face and a bonding layer formed by alloying the electrode and a conductive member lied between a rear face opposite to the main face of the semiconductor chip and the main face of the substrate, is fabricated with employing the semiconductor chip including at least two surface electrodes formed on the main face, and connection wiring portions provided by filling at least two holes respectively formed below the surface electrodes so as to penetrate the semiconductor chip from the main surface to the rear face with conductive materials.

According to the integrated circuit fabricated like this, a resistance between the surface electrodes provided on the semiconductor chip is measured, whereby the bonding condition between the semiconductor chip and the substrate can be evaluated, therefore, when all integrated circuits are fabricated to be this structure, it can be determined simply whether inferior or not.

Moreover, when the integrated circuit of the present invention is fabricated, the semiconductor chip which has a slit dividing a surface of the rear face into two may be used, and surface electrodes provided with an area capable of being touched with at least two external terminals may be used.

A first fabricating method of an integrated circuit is that of an integrated circuit including a semiconductor chip having active elements on a main face and a substrate having an electrode on a main face. The method comprises (a) forming at least two surface electrodes on the main face of the semiconductor chip, (b) forming connection wiring portions by making holes penetrating the semiconductor chip from a rear face opposite to the main face to the surface electrodes on the main surface and filling the holes with conductive materials, (c) forming two alienated conductive members on the rear face of the semiconductor chip, and (d) bonding the semiconductor chip with the substrate by putting the semiconductor chip on the substrate in a manner that the rear face of the semiconductor chip is opposite to the main face of the substrate and heating them.

According to this fabricating method, a resistance between the surface electrodes provided on the semiconductor chip is measured, whereby an integrated circuit which the bonding condition between the semiconductor chip and the substrate can be evaluated can be fabricated, therefore, when all integrated circuits are fabricated by this method, it can be determined whether a fabricated integrated circuit is inferior or not. Further, the two alienated conductive members are formed, therefore, when the bonding is not performed normally by any cause, a resistance between the surface electrodes becomes larger than a case in that an even conductive member is provided on the rear face of the semiconductor chip. Thus, it becomes easier to determine whether inferior or not. Additionally, when this fabricating method is used, it is desirable that two materials (elements) to be eutectic are used as the electrodes and the conductive members, however, it is also possible to use the same material (low melting point metal or alloy). Further, each of the surface electrodes is formed so as to be provided with an area capable of being contact with at least two external terminals, whereby it becomes possible to measure a resistance by the so-called four terminal method. Thus, it becomes possible to evaluate the bonding condition under no influence of the contact resistance. That is, though a difference of conditions in bonding portions is slight, an integrated circuit which the difference can be determined can be fabricated.

A second fabricating method of an integrated circuit is that of the integrated circuit including a semiconductor chip having active elements on a main face and a substrate having electrodes on a main face. The method comprises (a) forming four surface electrodes on the main face of the semiconductor chip, (b) forming connection wiring portions by making holes penetrating the semiconductor chip from a rear face opposite to the main face to the surface electrodes and filling the holes with conductive materials, (c) forming a groove portion dividing the surface of the rear face of the semiconductor into two, (d) providing conductive members on the rear face of the semiconductor chip expect for the groove portion, (e) forming the electrodes on the main face of the substrate in a manner that surface of the main face of the substrate is separated into two parts extending in a direction perpendicular to the groove portion, and (f) bonding the semiconductor chip and the substrate by putting the semiconductor chip on the substrate in a manner that the rear face of the semiconductor chip is opposite to the main face of the substrate and heating them.

According to this fabricating method, it becomes possible to obtain an integrated circuit in which conditions at various ranges in the bonding portion of the chip and the ceramic substrate can be evaluated with the combination of the four surface electrodes provided on the semiconductor chip. It also becomes possible to measure the resistance of the integrated circuit by the four terminal method or a bridge circuit, therefore, the bonding condition (resistance) can be detected under no influence of the contact resistance.

A first evaluating method of an integrated circuit intends to use for the integrated circuit including a semiconductor chip which has active elements on a main face and a substrate which has electrodes on a main face. The integrated circuit is fabricated by (a) a step of forming at least two surface electrodes on the main face of the semiconductor chip, (b) a step of forming connection wiring portions by making holes penetrating the semiconductor chip from a rear face opposite to the main face to the surface electrodes and filling the holes with conductive material, (c) a step of forming two alienated conductive members on the rear face of the semiconductor chip, and (d) a step of bonding the semiconductor chip and the substrate by putting the semiconductor chip on the substrate in a manner that the rear face of the semiconductor chip is opposite to the main face of the substrate and forming a bonding layer with alloying the conductive materials and the electrodes. Evaluation of a connecting condition between the semiconductor chip and the substrate is carried out by measuring resistance values between the surface electrodes or between one of the surface electrodes and the bonding layer.

A resistance value or the like between the surface electrodes or between one of the surface electrodes and the alloy layer is measured, whereby a condition of an alloy layer generated by alloying, namely, a connecting condition between the semiconductor chip and the substrate is evaluated.

Additionally, when this evaluating method is performed, it is desirable that each surface electrode is formed to be provided with an area capable of being contact with at least two external terminals, and the connecting condition between the semiconductor chip and the substrate is evaluated by applying a predetermined voltage between the surface electrodes with a pair of the external terminals and by measuring a voltage drop between the surface electrodes or between one of the surface electrodes and the bonding layer with another pair of the external terminals.

A second evaluating method of an integrated circuit intends to use for the integrated circuit including a semiconductor chip which has active elements on a main face and a substrate which has electrodes on a main face. The integrated circuit is fabricated by (a) a step of forming four surface electrodes on the main face of the semiconductor chip, (b) a step of forming connection wiring portions by making holes penetrating the semiconductor chip from a rear face opposite to the main face to the surface electrodes and filling the holes with conductive materials, (c) a step of forming a groove portion dividing the surface of the rear face of the semiconductor into two, (d) providing conductive members on the rear face of the semiconductor chip expect for the groove portion, (e) forming the electrodes on the main face of the substrate in a manner that surface of the main face of the substrate is separated into two parts extending in a direction perpendicular to the groove portion, and (f) bonding the semiconductor chip and the substrate by putting the semiconductor chip on the substrate in a manner that the rear face of the semiconductor chip is opposite to the main face of the substrate and forming a bonding layer with alloying the conductive materials and the electrodes. Evaluation of a connecting condition between the semiconductor chip and the substrate is carried out by measuring resistance values between the surface electrodes with contacting external terminals to the four surface electrodes in a manner that a bridge circuit is constructed.

BRIEF DESCRIPTION OF THE DRAWINGS

Other objects and advantages of the present invention will become apparent during the following discussion conjunction with the accompanying drawings, in which:

FIGS. 2(I) through 2(III) are explanatory views illustrating an evaluating method of an integrated circuit fabricated by the fabricating method according to the first embodiment;

DETAILED DESCRIPTION OF THE PREFERRED EMBODIMENTS

Preferred embodiments of the present invention will now be described with reference to the accompanying drawings.

<First Embodiment>

A fabricating method of an integrated circuit according to the first embodiment includes a step of processing a chip and a step of bonding the chip and a ceramic substrate actually so as to evaluate a bonding condition electrically.

Figure 1:
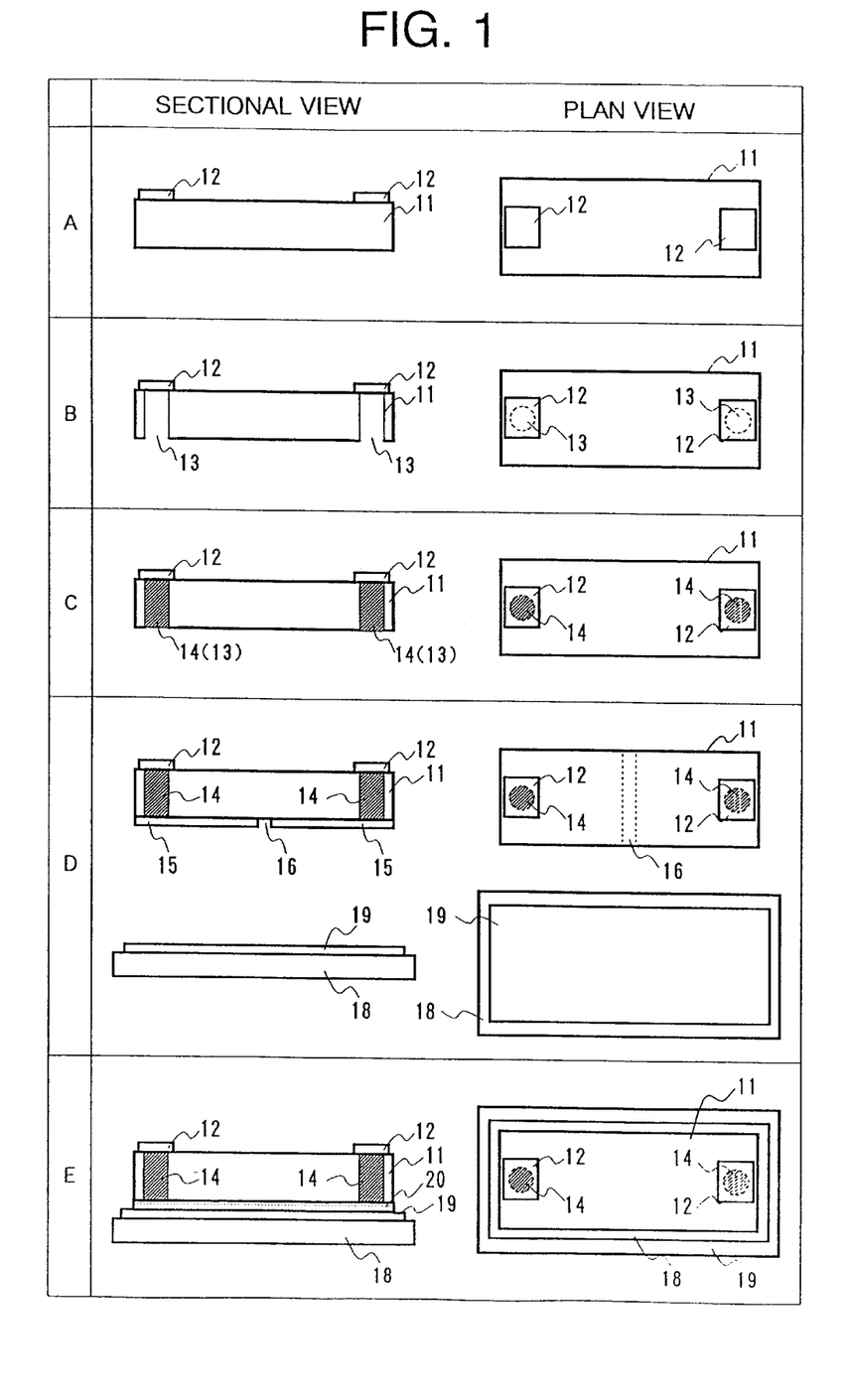
FIGS. 1(A) through 1(E) are step charts typically illustrating a fabricating method of an integrated circuit according to the first embodiment of the present invention.

A concrete explanation will be given of a fabricating method of an integrated circuit according to the first embodiment of the present invention with reference to FIGS. 1(A) through 1(E). As shown in FIG. 1(A), in this fabricating method, two external connecting electrodes 12 are formed on a surface of a chip 11. Additionally, in this embodiment, a chip (GaAsIC) in which an electronic circuit is fabricated on a GaAs substrate is used as the chip 11. The external connecting electrodes 12 are formed by forming a resist pattern which there is no resist in preset areas for forming the external connecting electrodes 12 on the chip 11 by photolithography method, thereafter, piling an Au (gold) film on the resist pattern by the vacuum evaporation method, and then removing the resist pattern (namely, lift-off method).

Then, a preformed resist pattern is formed on the rear face of the chip 11, and a dry etching is applied, whereby a structure which via holes 13 are formed below the respective external connecting electrodes 12 is obtained, as shown in FIG. 1(B). Thereafter, each via hole 13 is filled up with conductive material so as to form a conductive portion 14 electrically connected with the external connecting electrode 12 (see FIG. 1(C)). In this embodiment, the via hole 13 is filled up with Al (aluminum) by a plating method so as to form the conductive portion 14.

As shown in FIG. 1(D), a first metal film 15 and a second metal film 19 for the eutectic bonding are respectively formed on the rear face of the chip 11 processed like this and the surface of the ceramic substrate 18. In this case, when the first metal film 15 is formed on the rear face of the chip 11, as shown in FIG. 1(D), a portion where there is no first metal film 15 (hereinafter, called a slit portion 16) is provided at the center of the chip 11 by the lift-off method. The width of the slit portion 16 is set in a manner that continuous eutectic alloy layers are formed when the process for forming eutectic alloy between the first metal film 15 and the second metal film 15 is performed under a suitable condition. Additionally, in this embodiment, a vacuum evaporation film of Sn (tin) and that of Au (gold) are respectively used as the first metal film 15 and the second film 19, and the width of the slit portion 16 is 0.01 mm.

Thereafter, the chip 11 and the ceramic substrate 18 are temporally heated in contact with the first metal film 15 and the second metal film 16, so that a structure which a space between the chip 11 and the ceramic substrate 18 are filled and bonded with an eutectic alloy layer 20 is obtained (see FIG. 1(E)).

Now, the width of the silt portion 16 is set about 0.01 mm. The chip length (length in a direction perpendicular to the extending direction of the slit portion 16) is usually about 4 mm, so that a ratio of the slit portion 16 which no first metal film 15 is formed to the rear face of the chip is about 1/400, namely, very small. This degree is that no influence is given to an alloy layer by the slit portion 16.

Next, an explanation will be given of the evaluating method of a bonding condition in an integrated circuit fabricated by this fabricating method.

Figure 2A:
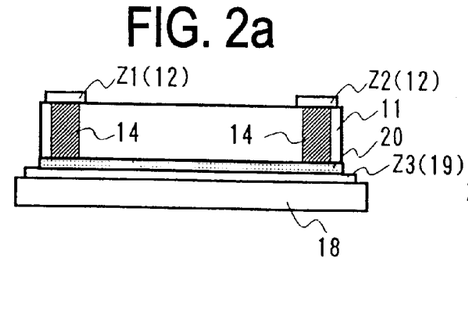
Figure 2B:
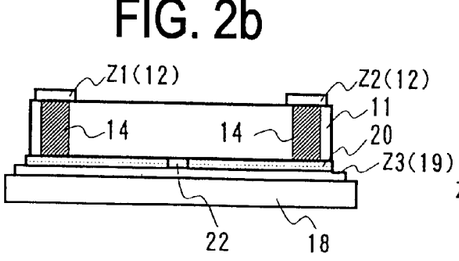
Figure 2C:
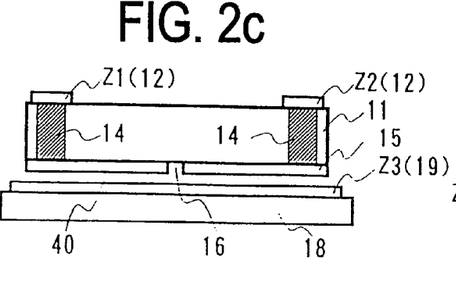
Figure 2D:
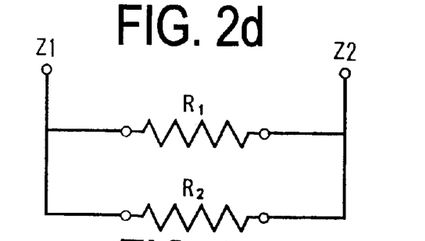
Figure 2E:
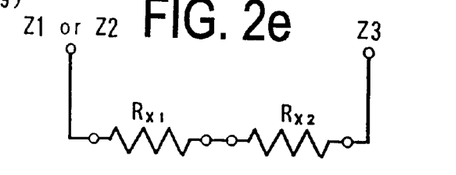
Figure 2F:
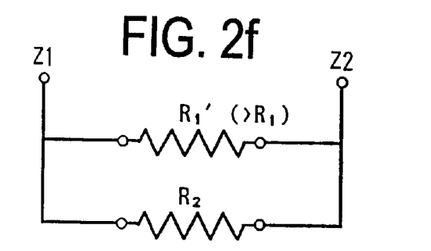
Figure 2G:
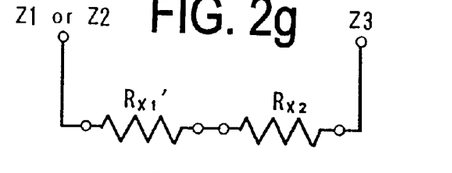
Figure 2H:
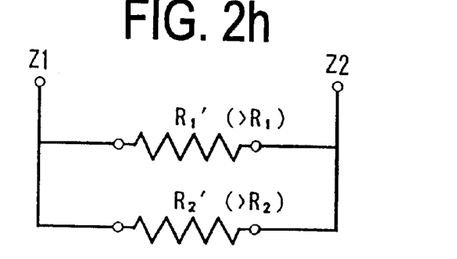
Figure 2I:
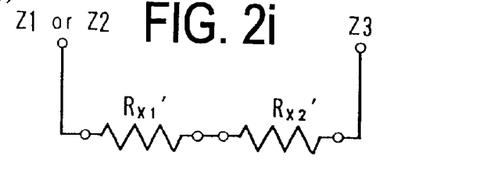

In this fabricating method, the metal film having the slit portion is formed on the rear face of the chip, therefore, when eutectic alloy is normally performed, as shown in FIG. 2(I), a eutectic alloy layer exists in an area which the slit portion has been formed. When eutectic alloy is performed under a condition which is different from an usual condition, as shown in FIG. 2(II), no eutectic alloy layer exists in an area which the slit portion has existed or a part of the slit portion is remained, whereby a defect such as a cavity 22 occurs. Moreover, as shown in FIG. 2(III) typically, there is a case that no eutectic alloy layer is formed in an interface 40 between the first metal film 15 and the second metal film 19. That is, when eutectic alloy is performed under a condition which is different from an usual condition, a defect which prevents to be conductive between the two external connecting electrodes 12 (hereinafter, called Z1, Z2) or between the external connecting electrode 12 and the second metal film 19 (hereinafter, called Z3).

Thus, when the bonding portion is formed normally, as shown in FIG. 2(I) typically, a resistance between the external connecting electrodes Z1, Z2 becomes a resistance $(R_1 \times R_2/(R_1+R_2))$ that a resistance $R_1$ of the eutectic alloy layer 20 in the horizonal direction and a resistance $R_2$ of the second metal film 19 in the horizontal direction are connected in parallel, whereas a resistance between the external connecting electrodes Z1, Z2 in a state shown in FIG. 2(II) becomes a resistance that a resistance $R_1'$ which is larger than the resistance $R_1$ and the resistance $R_2$ are connected in parallel. Moreover, a resistance between the external connecting electrodes Z1, Z2 in a state shown in FIG. 2(III) becomes a resistance that a resistance $R_1'$ which is larger than the resistance $R_1$ and a resistance $R_2'$ which is larger than the resistance $R_2$ are connected in parallel.

As above described, a resistance value between the external connecting electrodes Z1, Z2 in a case that the bonding portion (eutectic alloy layer 20) is not formed normally is larger than that in a case that the bonding portion is formed normally. Thus, it can be determined whether the bonding is performed normally or not by measuring the resistance value.

Similarly, when the bonding portion is formed normally, as shown in FIG. 2(I) typically, a resistance between the external connecting electrode Z1 or Z2 and the second metal film Z3 becomes a resistance ($R_{X1}+R_{X2}$) that a resistance $R_{X1}$ of the eutectic alloy layer 20 in the longitudinal direction and a resistance $R_{X2}$ of the second metal film 19 in the longitudinal direction are connected in series, whereas a resistance between the external connecting electrode Z1 or Z2 and the second metal film Z3 in a state shown in FIG. 2(II) becomes a resistance that a resistance $R_{X1}'$ which is larger than the resistance $R_{X1}$ and the resistance $R_{X2}$ are connected in series. Moreover, a resistance between the external connecting electrode Z1 or Z2 and the second metal film Z3 in a state shown in FIG. 2(III) becomes a resistance that a resistance $R_{X1}'$ which is larger than the resistance $R_{X1}$ and a resistance $R_{X2}'$ which is larger than the resistance $RX_2$ are connected in series.

That is, a resistance value between the external connecting electrodes Z1 or Z2 and the second metal film Z3 in the case that the bonding portion (eutectic alloy layer 20) is not formed normally is larger than that in the case that the bonding portion is formed normally. Thus, it can be determined whether the bonding is performed normally or not by measuring the resistance value.

<Second Embodiment>

In the fabricating method explained in the first embodiment, any material can be used for the first and second metal films, however, when the resistance of the eutectic alloy layer formed as the result is very small, an influence of a contact resistance between a probe for resistance measurement and the external connecting electrode becomes larger, therefore, it becomes difficult to determine whether a bonding portion is formed normally or not.

Figure 3:
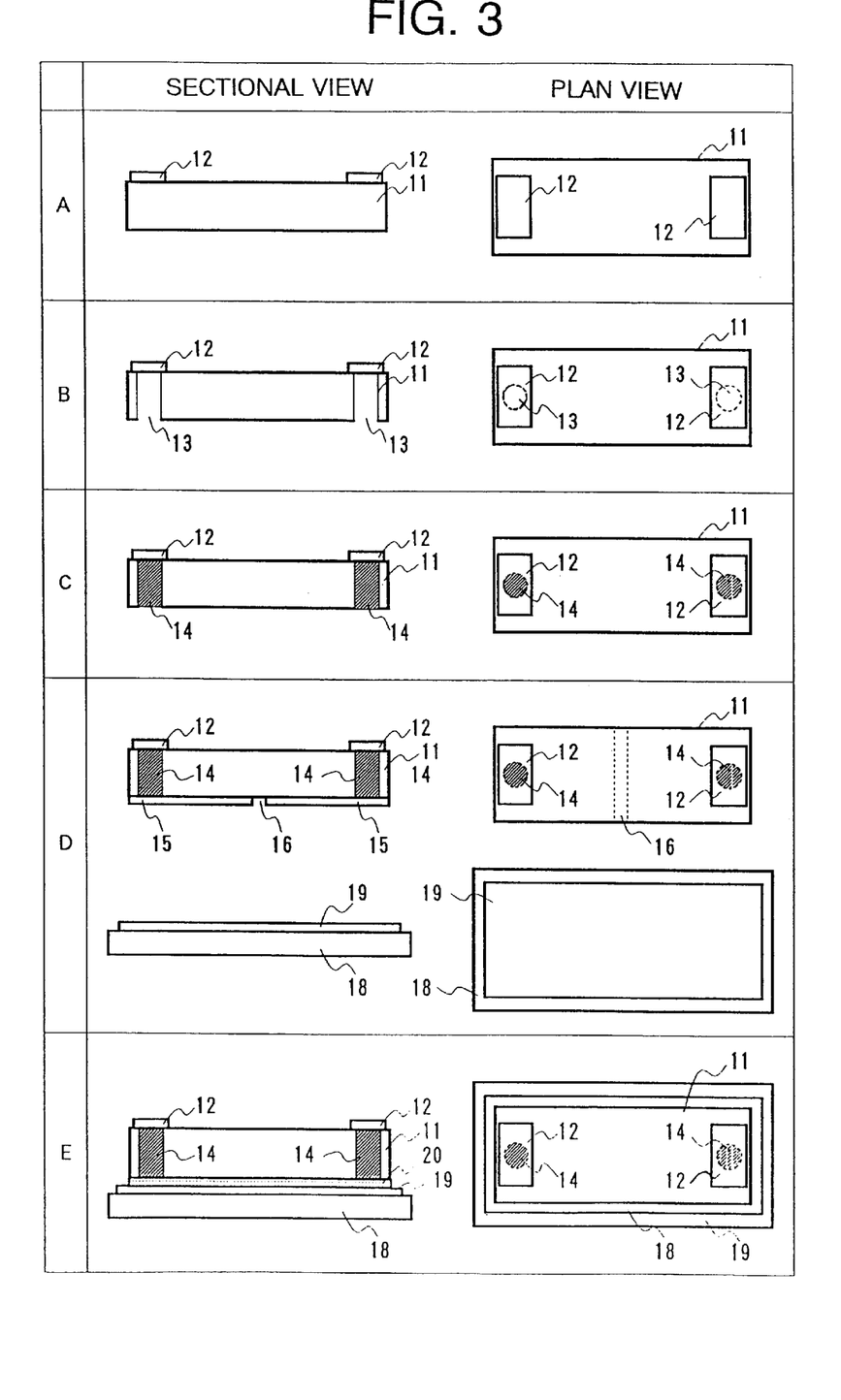
FIGS. 3(A) through 3(E) are step charts typically illustrating a fabricating method of an integrated circuit according to the second embodiment of the present invention.
Figure 4A:
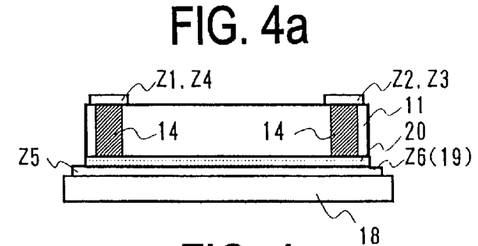
FIG. 4 is a first explanatory view illustrating an evaluating method of an integrated circuit fabricated by the fabricating method according to the second embodiment.
Figure 4B:
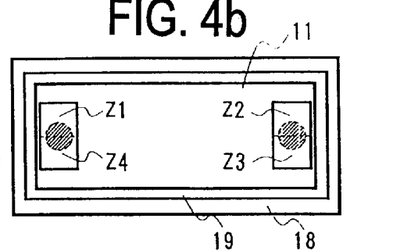
Figure 4C:
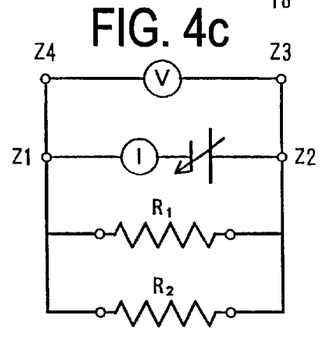
Figure 4D:
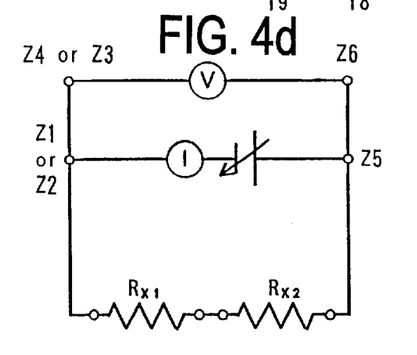
Figure 5A:
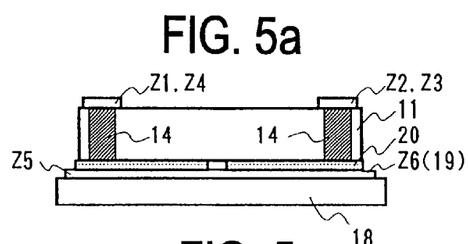
FIG. 5 is a second explanatory view illustrating an evaluating method of an integrated circuit fabricated by the fabricating method according to the second embodiment.
Figure 5B:
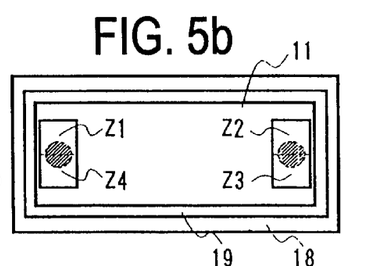
Figure 5C:
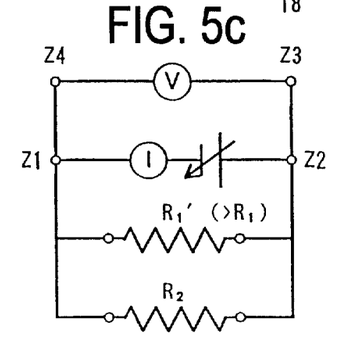
Figure 5D:
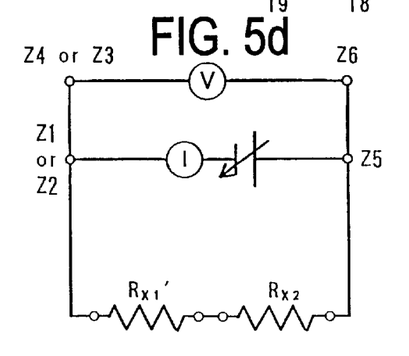
Figure 6A:
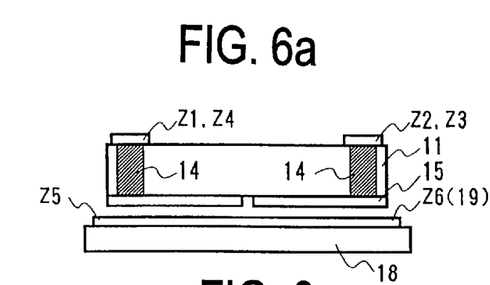
FIG. 6 is a third explanatory view illustrating an evaluating method of an integrated circuit fabricated by the fabricating method according to the second embodiment.
Figure 6B:
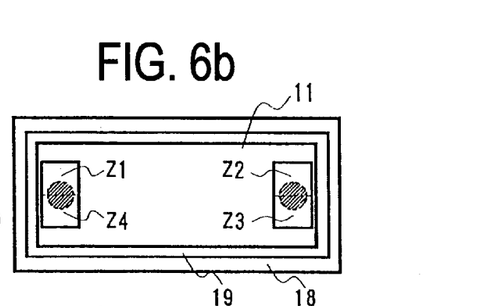
Figure 6C:
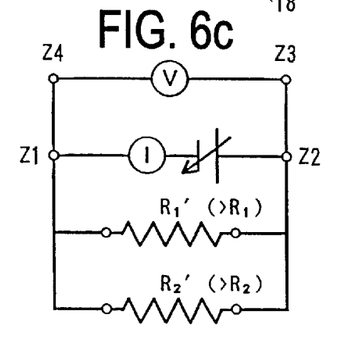
Figure 6D:
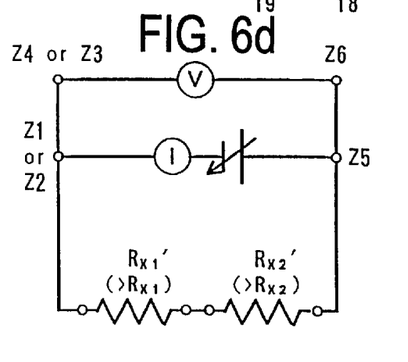

In the fabricating method of the second embodiment, to solve those problems, as shown in FIG. 3(A) typically, the size of the external connecting electrode 12 formed on the chip 11 is set in a manner that two probes for resistance measurement can be contact. The fabricating procedures after that are similar to those in the first embodiment, therefore, the explanation is omitted.

Then, when the integrated circuit is evaluated, as shown in FIGS. 4 through 6, two probes are touched to each external connecting electrode 12. That is, the external connecting electrodes 12 are respectively used as two electrodes (Z1 and Z3, Z2 and Z4), whereby the resistance (voltage drop between Z3 and Z4) in the bonding portion is measured by the four-terminal method. The bonding condition is determined based on the measured result.

That is, when the bonding portion is formed normally, as shown in FIG. 4 typically, a voltage drop between the external connecting electrodes Z3 and Z4 is based on a resistance ($R_1 \times R_2/(R_1+R_2)$) that a resistance $R_1$ of the eutectic alloy layer 20 in the horizonal direction and a resistance $R_2$ of the second metal film 19 in the horizonal direction are connected in parallel, whereas when the bonding portion is not formed normally, such as shown FIG. 5, a voltage drop between the external connecting electrodes Z3, Z4 is based on a resistance that a resistance $R_1'$ which is larger than the resistance $R_1$ and the resistance $R_2$ are connected in parallel. Moreover, as shown in FIG. 6, when no eutectic alloy layer is formed, a voltage drop between the external connecting electrodes Z4 and Z3 is based on a resistance that a resistance $R_1'$ which is larger than the resistance $R_1$ and a resistance $R_2'$ which is larger than the resistance $R_2$ are connected in parallel.

As above described, the voltage drop between the external connecting electrodes Z3 and Z4 in the case that the bonding portion (eutectic alloy layer 20) is not formed normally is different from that in the case that the bonding portion is formed normally. Thus, it can be determined whether the bonding is performed normally or not by measuring the voltage drop.

Similarly, when the bonding portion is formed normally, as shown in FIG. 4 typically, a voltage drop between the external connecting electrode Z4 or Z3 and the second metal film Z6 is based on a resistance ($R_{X1}+R_{X2}$) that a resistance $R_{X1}$ of the eutectic alloy layer 20 in the longitudinal direction and a resistance $R_{X2}$ of the second metal film 19 in the longitudinal direction are connected in series, whereas a voltage drop between the external connecting electrode Z3 or Z4 and the second metal film Z6 in a state shown in FIG. 5 is based on a resistance that a resistance $R_{X1}'$ which is larger than the resistance $R_{X1}$ and the resistance $R_{X2}$ are connected in series. Moreover, a voltage drop between the external connecting electrode Z4 or Z3 and the second metal film Z6 in a state shown in FIG. 6 is based on a resistance that a resistance $R_{X1}'$ which is larger than the resistance $R_{X1}$ and a resistance $R_{X2}'$ which is larger than the resistance $R_{X2}$ are connected in series.

That is, a voltage drop between the external connecting electrodes Z4 or Z3 and the second metal film Z6 in the case that the bonding portion (eutectic alloy layer 20) is not formed normally is larger than that in the case that the bonding portion is formed normally. Thus, it can be determined whether the bonding is performed normally or not by measuring the voltage drop.

<Third Embodiment>

Figure 7:
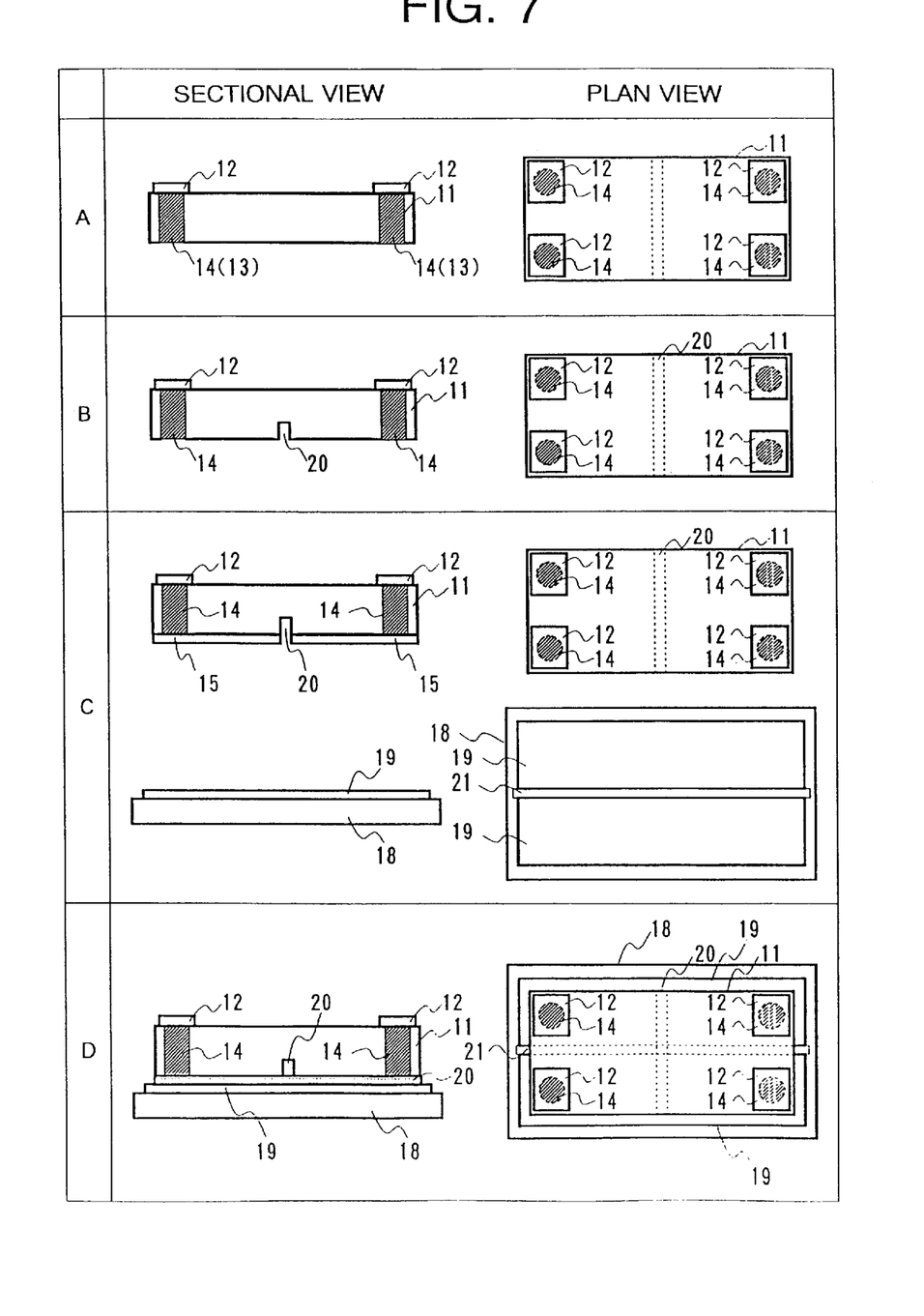
FIGS. 7(A) through 7(D) are step charts typically illustrating a fabricating method of an integrated circuit according to the third embodiment of the present invention.

Next, a concrete explanation will be given of a fabricating method of an integrated circuit according to the third embodiment of the present invention with reference to FIG. 7.

In this fabricating method, first, with the same procedures in the first embodiment, the chip 11 is processed in a manner that four external connecting electrodes 12 and conductive portions 14 are provided (see FIG. 7(A)). Then, a preformed resist pattern is formed on the rear face of the chip 11, and the dry etching is performed, whereby, as shown in FIG. 7(B), a first groove 20 is formed in the center portion of the rear face of the chip 11. In this embodiment, the first groove 20 is formed to be 0.01 mm in width and 0.05 mm in depth.

Then, as shown in FIG. 7(C), a first metal film 15 for the eutectic bonding is formed on the rear face of the chip 11 which is processed like this. Incidentally, no first metal film 15 exists in the groove 20.

Further, a preformed resist pattern is formed on the surface of the ceramic substrate 18, and the dry etching is performed, whereby, as shown in FIG. 7(C), a second groove 21 perpendicular to the first groove 20 is formed in the center portion of the ceramic substrate 18. Then, a second metal film 19 is formed on the ceramic substrate 18 which the second groove 21 is formed not so as to fill the second groove 21. Additionally, it is desirable that the second groove 21 is formed so as not to block the eutectic alloy, therefore, in this embodiment, the second groove 21 is formed to be 0.01 mm in width and 0.05 mm in depth. The area ratio of the width of the groove 21 to the rear face of the chip is about 1/400 similarly to the silt portion in the first embodiment.

Then, the chip 11 and the ceramic substrate 18 are heated temporarily in a state that the first metal film 15 and the second metal film 19 are contact, whereby a structure (see FIG. 7(D)) which a space between the chip 11 and the ceramic substrate 18 is filled and bonded with the eutectic alloy layer 20 is obtained.

Next, an explanation will be given of an evaluating method of a bonding condition in an integrated circuit fabricated by this fabricating method.

Figure 8A:
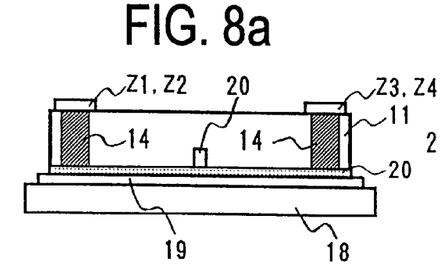
FIG. 8 is an explanatory view illustrating an evaluating method of an integrated circuit fabricated by the fabricating method according to the third embodiment.
Figure 8B:
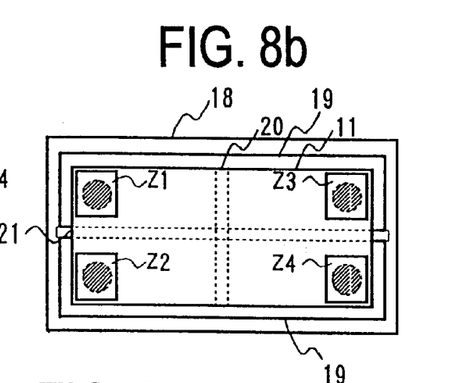
Figure 8C:
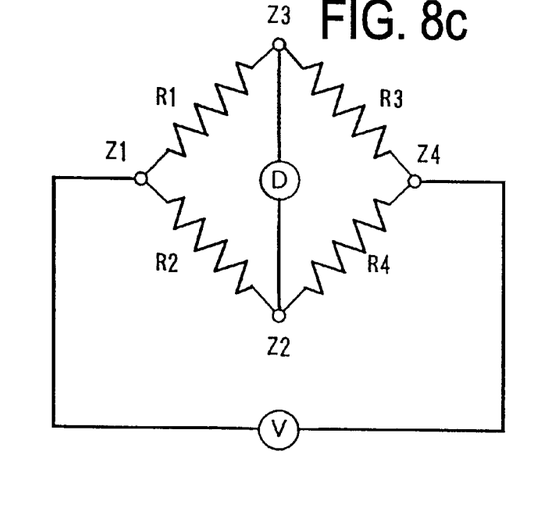

As clear from the above-described fabricating steps, when the eutectic alloy is formed normally, layers of which borders are the first groove 20 and the second groove 20 and each of which has the same form and the same characteristic are formed under the respective external connecting electrodes 12 (conductive portions 14) provided in the integrated circuit. Thus, as shown in FIG. 8, a bridge circuit is structured by using the four external connecting electrodes 12 of the integrated circuit fabricated by this fabricating method, and when a voltage is applied to the external connecting electrodes Z1 and Z4, no current runs between the external connecting electrodes Z2 and Z3. That is, when the eutectic alloy is formed normally, the resistance values of the resistances R1–R4 between the respective external connecting electrodes become flat, therefore, no current runs between the external connecting electrodes Z2 and Z3. On the contrary, when the eutectic alloy is not formed normally, the resistance values of the resistances R1–R4 between the respective external connecting electrodes is not flat, therefore, a potential difference generates between the external connecting electrodes Z2 and Z3, so that a current corresponding to the state of the bonding portion runs between the external connecting electrodes Z2 and Z3. Thus, the bonding condition can be evaluated by measuring like this.

Additionally, in each above-described embodiment, the GaAsIC is used, however, the fabricating method of the present invention can be also applied to an IC on a InP substrate, a Si on sapphire IC and so on. In the first and second embodiments, the slit portion 16 is provided while the first metal film 15 is formed. Although a difference of the resistance values between a normal case and an abnormal case becomes small compared with that the slit portion 16 is provided, the resistance value between the external connecting electrodes 12 also varies in accordance with the state of the bonding portion though no slit portion 16 is provided. Thus, though the fabricating method explained in each embodiment is performed without providing the slit portion 16, an integrated circuit which a bonding condition can be simply evaluated can be also obtained. Moreover, in each embodiment, the explanation is given as to the eutectic alloy method, however, each embodiment may be applied to the solder bonding.

As above explained in detail, an integrated circuit can be determined electrically about a bonding condition between a chip and a ceramic substrate, therefore, all integrated circuits are fabricated in accordance with the preset invention, whereby it can be simply determined whether all of them are inferior or not.

According to the fabricating method of the present invention, an integrated circuit which a bonding condition (a condition of a conductive member) between a chip and a ceramic substrate can evaluated is obtained, therefore, it can be simply determined whether the fabricated integrated circuit is inferior or not. Particularly, when a slit-shaped portion is formed, a difference between the resistances in the bonding portion of the integrated circuit fabricated in a case that the bonding is performed not normally by any cause and in a case that the bonding is performed normally can be made lager, therefore, it can be more easily determined whether inferior or not.

This invention being thus described, it will be obvious that same may be varied in various ways. Such variations are not to be regarded as departure from the spirit and scope of the invention, and all such modifications would be obvious for one skilled in the art intended to be included within the scope of the following claims.

What is claimed is:

1. A method of evaluating the bonding between a semiconductor chip, having active elements on a main face, and a substrate, having at least one electrode on a main face, of an integrated circuit, said method comprising:
    fabricating said integrated circuit by the steps of:
        forming at least two separated surface electrodes on the main face of the semiconductor chip;
        forming connection wiring portions by making holes penetrating the semiconductor chip from a rear face opposite to the main face to the surface electrodes and filling the holes with conductive material;
        forming two separated conductive members on the rear face of the semiconductor chip to provide electrical contact to the respective connection wiring portions; and
        bonding the semiconductor chip and the substrate by placing the semiconductor chip on the substrate in a manner that the rear face of the semiconductor chip is opposite to the main face of the substrate and by forming a bonding layer by alloying the conductive members and the electrodes on the main face of the substrate and thereafter
    evaluating a connecting condition between the semiconductor chip and the substrate by measuring resistance values between the surface electrodes.

2. A method of evaluating the bonding between a semiconductor chip, having active elements on a main face, and a substrate, having at least one electrode on a main face, of an integrated circuit, said method comprising:
    fabricating said integrated circuit by the steps of:
        forming at least two separated surface electrodes on the main face of the semiconductor chip, with each of the surface electrodes being provided with an area capable of being touched with at least two external terminals;
        forming connection wiring portions by making holes penetrating the semiconductor chip from a rear face opposite to the main face to the surface electrodes and filling the holes with conductive material;
        forming two separated conductive members on the rear face of the semiconductor chip to provide electrical contact to the respective connection wiring portions; and
        bonding the semiconductor chip and the substrate by placing the semiconductor chip on the substrate in a manner that the rear face of the semiconductor chip is opposite to the main face of the substrate and by forming a bonding layer by alloying the conductive members and the electrodes on the main face of the substrate; and
    evaluating a connecting condition between the semi conductor chip and the substrate by measuring resistance values between the surface electrodes, wherein the connecting condition between the semiconductor chip and the substrate is evaluated by applying a predetermined voltage between the surface electrodes with a pair of the external terminals, and by measuring a voltage drop between the surface electrodes with another pair of the external terminals.

3. A method of evaluating the bonding between a semiconductor chip, having active elements on a main face, and a substrate, having electrodes on a main face, of an integrated circuit, said method comprising:

fabricating said integrated circuit by the steps of:

forming four surface electrodes on the main face of the semiconductor chip;

forming connection wiring portions by making holes penetrating the semiconductor chip from a rear face opposite to the main face to the surface electrodes and filling the holes with conductive materials;

forming a groove portion dividing the surface of the rear face of the semiconductor chip into two;

providing conductive members on the rear face of the semiconductor chip except for the groove portion;

forming the electrodes on a main face of the substrate in a manner that a surface of the main face of the substrate is separated into two parts extending in a direction perpendicular to the groove portion; and bonding the semiconductor chip and the substrate by putting the semiconductor chip on the substrate in a manner that the rear face of the semiconductor chip is opposite to the main face of the substrate, and forming a bonding layer by alloying of the conductive members and the electrodes on the substrates; and evaluating a connecting condition between the semiconductor chip and the substrate by measuring resistance values between the surface electrodes with external terminals connecting the four surface electrodes in a manner such that a bridge circuit is constructed.

4. The method according to claim 1 wherein the semiconductor chip is formed of a semi-insulating material.

5. The method according to claim 2 wherein the semiconductor chip is formed of a semi-insulating material.

6. The method according to claim 3 wherein the semiconductor chip is formed of a semi-insulating material.

7. The method according to claim 4 wherein the substrate to be bonded to the chip is a ceramic substrate.

8. The method according to claim 5 wherein the substrate to be bonded to the chip is a ceramic substrate.

9. The method according to claim 6 wherein the substrate to be bonded to the chip is a ceramic substrate.

10. The method according to claim 1 wherein the alloying is carried out by one of solder bonding and eutectic bonding.

11. The method according to claim 2 wherein the alloying is carried out by one of solder bonding and eutectic bonding.

12. The method according to claim 3 wherein the alloying is carried out by one of solder bonding and eutectic bonding.

13. The method according to claim 7 wherein the alloying is carried out by one of solder bonding and eutectic bonding.

14. The method according to claim 8 wherein the alloying is carried out by one of solder bonding and eutectic bonding.

15. The method according to claim 9 wherein the alloying is carried out by one of solder bonding and eutectic bonding.

16. The method according to claim 1 wherein: the two separated conductive members cover substantially the entire rear face of the semiconductor chip; and the electrode on the substrate covers substantially the entire main face of the substrate.

17. The method according to claim 2 wherein: the two separated conductive members cover substantially the entire rear face of the semiconductor chip; and the electrode on the substrate covers substantially the entire main face of the substrate.

18. The method according to claim 1 wherein the step of evaluating further includes measuring resistance values between one of the surface electrodes on the main face of the semiconductor chip and the bonding layer.

19. The method according to claim 2 wherein the step of evaluating further includes measuring resistance values between one of the surface electrodes on the main face of the semiconductor chip and the bonding layer.

20. The method according to claim 1 wherein the step of evaluating further includes determining, from the measured resistance values, whether the separated conductive members are connected to one another by the alloying.

* * * * *

UNITED STATES PATENT AND TRADEMARK OFFICE
CERTIFICATE OF CORRECTION

PATENT NO.   : 6,423,559 B2
DATED        : July 23, 2002
INVENTOR(S)  : Masahisa Ikeya and Kazuyuki Inokuchi It is certified that error appears in the above-identified patent and that said Letters Patent is hereby corrected as shown below:

<u>Title page,</u>
Item [54], should read -- INTEGRATED CIRCUIT AND FABRICATING METHOD AND EVALUATING METHOD OF INTEGRATED CIRCUIT BONDING WITH A SUBSTRATE --

<u>Column 11,</u>
Line 21, correct "and the electrodes on the substrates" to read -- and the electrodes on the substrate --

Signed and Sealed this

Eighteenth Day of March, 2003

JAMES E. ROGAN
*Director of the United States Patent and Trademark Office*

UNITED STATES PATENT AND TRADEMARK OFFICE
CERTIFICATE OF CORRECTION

PATENT NO.   : 6,423,559 B2
DATED        : July 23, 2002
INVENTOR(S)  : Masahisa Ikeya et al.

It is certified that error appears in the above-identified patent and that said Letters Patent is hereby corrected as shown below:

<u>Title page,</u>
Item [73], after "Co.," insert -- Ltd. --

Signed and Sealed this

Thirteenth Day of May, 2003

JAMES E. ROGAN
*Director of the United States Patent and Trademark Office*